US011863245B2

(12) United States Patent
Uematsu et al.

(10) Patent No.: US 11,863,245 B2
(45) Date of Patent: Jan. 2, 2024

(54) SIGNAL TRANSMISSION DEVICE AND SIGNAL TRANSMISSION SYSTEM

(71) Applicant: Hitachi Astemo, Ltd., Hitachinaka (JP)

(72) Inventors: Yutaka Uematsu, Tokyo (JP); Hideyuki Sakamoto, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/928,322

(22) PCT Filed: Feb. 26, 2021

(86) PCT No.: PCT/JP2021/007456
§ 371 (c)(1),
(2) Date: Nov. 29, 2022

(87) PCT Pub. No.: WO2021/261014
PCT Pub. Date: Dec. 30, 2021

(65) Prior Publication Data

US 2023/0216540 A1 Jul. 6, 2023

(30) Foreign Application Priority Data

Jun. 22, 2020 (JP) ................................ 2020-107187

(51) Int. Cl.
*H04B 3/54* (2006.01)
*H04B 3/21* (2006.01)
*H04B 3/46* (2015.01)

(52) U.S. Cl.
CPC ................ *H04B 3/54* (2013.01); *H04B 3/21* (2013.01); *H04B 3/46* (2013.01)

(58) Field of Classification Search
CPC . H04B 3/54; H04B 3/548; H04B 3/46; H04B 3/21; H04L 25/02
See application file for complete search history.

(56) References Cited

U.S. PATENT DOCUMENTS 11,290,291 B2 * 3/2022 Gardner .............. H04L 25/0298
11,418,369 B2 * 8/2022 Gardner .............. H04L 25/0266
(Continued)

FOREIGN PATENT DOCUMENTS

JP 2016-046815 A 4/2016
JP 2017-034592 A 2/2017
(Continued)

OTHER PUBLICATIONS

International Search Report with English Translation and Written Opinion dated Apr. 20, 2021 in corresponding International Application No. PCT/JP2021/007456.

*Primary Examiner* — Khanh C Tran
(74) *Attorney, Agent, or Firm* — Foley & Lardner LLP

(57) ABSTRACT

A signal transmission device includes a communication unit that is connected to an electronic device by a signal wiring and performs communication with the electronic device via the signal wiring, a signal processing unit that performs signal processing related to the communication, a power supply unit that supplies direct current to the electronic device via the signal wiring, and a filter circuit connected between the signal wiring and the power supply unit. The filter circuit includes a plurality of filters having frequency characteristics different from each other, and the signal processing unit acquires communication quality information indicating quality of the communication in at least two or more frequency bands, and determines a state of the filter circuit based on the communication quality information.

11 Claims, 13 Drawing Sheets

1
11
COMMUNICATION UNIT
113
COMMUNICATION SPEED CHANGE FUNCTION
15
$S_f$
12
SIGNAL PROCESSING UNIT
$Q_f$
FILTER STATE DETERMINATION UNIT
120
L1
L2
110
112
POWER SUPPLY UNIT
14
$I_d$
13
$V_o$

(56) References Cited

U.S. PATENT DOCUMENTS

2006/0227884 A1* 10/2006 Koga ........................ H04B 3/54
375/257
2013/0063255 A1* 3/2013 Washiro ................... H04B 3/56
340/12.32
2016/0054777 A1 2/2016 Dwelley et al.
2016/0297305 A1* 10/2016 Ichikawa ................ B60L 53/36
2016/0344236 A1* 11/2016 Misawa .................. H02M 1/36
2019/0016226 A1* 1/2019 Misawa ................ B60L 53/122
2019/0157907 A1* 5/2019 Sugiyama ............... H02J 50/80
2019/0386630 A1 12/2019 Higuchi et al.
2020/0041381 A1 2/2020 Inagaki et al.
2020/0172028 A1 6/2020 Kawauchi et al.
2022/0190874 A1 6/2022 Uematsu et al.

FOREIGN PATENT DOCUMENTS

JP 2018-196084 A 12/2018
JP 2020-022329 A 2/2020
WO WO-2018/168282 A1 9/2018
WO WO-2020/171202 A1 8/2020

* cited by examiner

FIG. 11

| FAILED MODULE | FAILED COMPONENT | FAILURE MODE | DEGENERATION MODE (COMMUNICATION) | DEGENERATION MODE (CONTROL) |
|---|---|---|---|---|
| SENSOR | L1 TO L3 | Open | STOP | STOP USE OF TARGET CAMERA |
| | L1 (RADIO FREQUENCY) | Short | LOWER SPEED OF FORWARD CHANNEL | DEGENERATION OF CAMERA FUNCTION (LOWER RESOLUTION/TONE/FRAME RATE) |
| | L2 (INTERMEDIATE FREQUENCY) | Short | CHANGE ENCODING OF FORWARD CHANNEL LOWER SPEED OF BACKWARD CHANNEL | DEGENERATION OF CAMERA FUNCTION AS NEEDED |
| | L3 (LOW FREQUENCY) | Short | IMPROVE SPEED OF BACKWARD CHANNEL | MAINTAIN CAMERA FUNCTION ALTHOUGH POWER CONSUMPTION INCREASES |
| ECU | L1 TO L3 | Open | STOP | STOP USE OF TARGET CAMERA |
| | L1 (RADIO FREQUENCY) | Short | LOWER SPEED OF FORWARD CHANNEL | DEGENERATION OF CAMERA FUNCTION (LOWER RESOLUTION/TONE/FRAME RATE) SWITCH CAMERA |
| | L2 (INTERMEDIATE FREQUENCY) | Short | CHANGE ENCODING OF FORWARD CHANNEL LOWER SPEED OF BACKWARD CHANNEL | DEGENERATION OF CAMERA FUNCTION AS NEEDED AND SWITCH CAMERA |
| | L3 (LOW FREQUENCY) | Short | IMPROVE SPEED OF BACKWARD CHANNEL | MAINTAIN CAMERA FUNCTION ALTHOUGH POWER CONSUMPTION INCREASES |

SIGNAL TRANSMISSION DEVICE AND SIGNAL TRANSMISSION SYSTEM

TECHNICAL FIELD

The present invention relates to a signal transmission device and a signal transmission system.

BACKGROUND ART

In recent years, in signal transmission between devices mounted on a vehicle, in order to reduce weight and cost of a wire harness, employment of a transmission method called a power over coax (PoC) that realizes signal transmission and power supply with a single coaxial cable that is light-weight and low in cost has been progressing. In the PoC, a signal and a power supply are separated using a filter circuit called a PoC filter mounted on each of a transmission side device and a reception side device, so that it is possible to cause the signal and the power supply to flow in a manner superimposed on a single coaxial cable without adversely affecting signal quality.

In a case where the PoC is employed, if a PoC filter fails, a signal cannot be correctly transmitted, and thus it is necessary to reliably detect a failure of the PoC filter.

As a background art related to the present invention, PTL 1 is known. PTL 1 describes a circuit module including a wiring board provided with a ground plane, a signal line, and a conductive pattern connected to an external conductor of a coaxial cable including an internal conductor and the external conductor, a common mode choke coil mounted on the wiring board in a manner that one coil connects the ground plane and the conductive pattern and the other coil is inserted into the signal line, a communication element including a first signal terminal and a second signal terminal, the first signal terminal being connected to the common mode choke coil via the signal line and the second signal terminal being connected to the ground plane, and a first capacitor inserted in series in the signal line between the common mode choke coil and the first signal terminal.

CITATION LIST

Patent Literature

PTL 1: WO 2018/168282 A

SUMMARY OF INVENTION

Technical Problem

The technique of PTL 1 reduces leakage of common mode noise from a circuit on the wiring board to the coaxial cable and suppresses propagation of common mode noise picked up by the coaxial cable to a circuit on the wiring board by arranging the common mode choke coil between the communication element and the coaxial cable. However, the technique of PTL 1 cannot detect a failure of a filter circuit used as a PoC filter.

Solution to Problem

A signal transmission device according to the present invention includes a communication unit that is connected to an electronic device by a signal wiring and performs communication with the electronic device via the signal wiring, a signal processing unit that performs signal processing related to the communication, a power supply unit that supplies direct current to the electronic device via the signal wiring, and a filter circuit connected between the signal wiring and the power supply unit. The filter circuit includes a plurality of filters having frequency characteristics different from each other, and the signal processing unit acquires communication quality information indicating quality of the communication in at least two or more frequency bands, and determines a state of the filter circuit based on the communication quality information.

A signal transmission system according to the present invention includes a first electronic device and a second electronic device connected to the first electronic device by a signal wiring. The first electronic device includes a first communication unit that performs communication with the second electronic device via the signal wiring, a first signal processing unit that performs signal processing related to the communication, a first power supply unit that supplies direct current to the second electronic device via the signal wiring, and a first filter circuit connected between the signal wiring and the first power supply unit, the second electronic device includes a second communication unit that performs communication with the first electronic device via the signal wiring, a second signal processing unit that performs signal processing related to the communication, a second power supply unit that supplies power to the second communication unit and the second signal processing unit by using the direct current supplied from the first electronic device via the signal wiring, and a second filter circuit connected between the signal wiring and the second power supply unit, each of the first filter circuit and the second filter circuit includes a plurality of filters having frequency characteristics different from each other, and the first signal processing unit acquires communication quality information indicating quality of the communication in at least two or more frequency bands, and determines a state of the first filter circuit and the second filter circuit based on the communication quality information.

Advantageous Effects of Invention

According to the present invention, it is possible to detect a failure of a filter circuit used as a PoC filter.

An object, configuration, and effect other than those described above will be clarified by description of an embodiment for implementing the invention below.

BRIEF DESCRIPTION OF DRAWINGS

FIG. 11 is a table for explaining an operation control example of an electronic device performed on the basis of a result of the communication abnormality determination.

DESCRIPTION OF EMBODIMENTS

Figure 1:
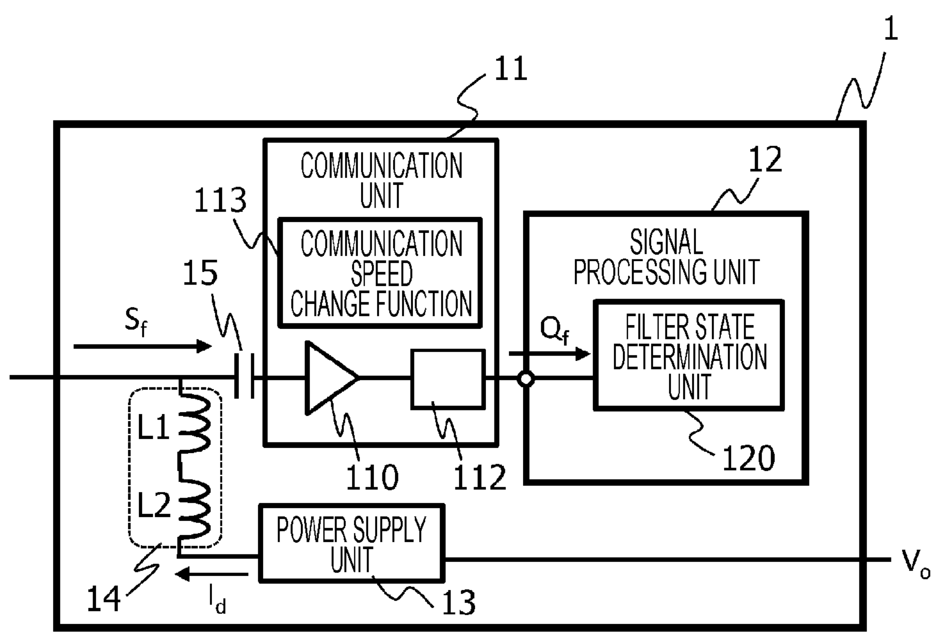
FIG. 1 is a diagram illustrating a configuration of a signal transmission device according to a first embodiment of the present invention.

Hereinafter, an embodiment of the present invention will be described with reference to the drawings. Description and drawings below are examples for describing the present invention, and omission and simplification are made as appropriate for the sake of clarity of description. The present invention can be carried out in other various forms. Unless otherwise specified, each constituent may be singular or plural.

There is a case where a position, size, shape, range, and the like of each constituent illustrated in the drawings do not represent an actual position, size, shape, range, and the like, in order to facilitate understanding of the invention. For this reason, the present invention is not necessarily limited to a position, size, shape, range, and the like disclosed in the drawings.

In a case where there are a plurality of constituents having the same or similar functions, description may be made by attaching different subscripts to the same reference numerals. However, in a case where a plurality of such constituents do not need to be distinguished from each other, the description may be made by omitting a subscript.

Further, in description below, there is a case where processing performed by executing a program will be described. However, the program is executed by a processor (for example, CPU or GPU) to perform predetermined processing using a storage resource (for example, a memory) and/or an interface device (for example, a communication port) as appropriate. Therefore, the subject of the processing may be the processor. Similarly, the subject of the processing performed by executing the program may be a control unit, a device, a system, a computer, or a node having the processor. The subject of the processing performed by executing the program only needs to be an arithmetic unit, and may include a dedicated circuit (for example, an FPGA or an ASIC) that performs specific processing.

The program may be installed in a device such as a computer from a program source. The program source may be, for example, a program distribution server or a computer-readable storage medium. In a case where the program source is a program distribution server, the program distribution server may include a processor and a storage resource that stores a program to be distributed, and the processor of the program distribution server may distribute a program to be distributed to another computer. Further, in description below, two or more programs may be realized as one program, or one program may be realized as two or more programs.

First Embodiment

FIG. 1 is a diagram illustrating a configuration of a signal transmission device 1 according to a first embodiment of the present invention. The signal transmission device 1 illustrated in FIG. 1 is a type of electronic device, and realizes various functions by performing communication with another electronic device. For example, when an electronic control unit (ECU) that performs image processing for automatic driving is used as the signal transmission device 1, the signal transmission device 1 receives an image signal transmitted from a camera installed in a vehicle, and performs various types of arithmetic processing related to automatic driving of the vehicle on the basis of the received image signal. The signal transmission device 1 includes a communication unit 11, a signal processing unit 12, a power supply unit 13, a filter circuit 14, and a capacitor 15.

The communication unit 11 includes a reception circuit 110 and a communication signal processing unit 112. A communication signal Sf in a predetermined frequency band transmitted from an electronic device 2 (see FIG. 4) connected to the signal transmission device 1 via a signal wiring 4 (see FIG. 4) to the signal transmission device 1 is input to the communication unit 11 via the capacitor 15. The communication signal Sf is, for example, a serial signal representing "1" and "0" of data by a voltage difference, and voltage changes every predetermined period. A communication speed of the communication signal Sf is determined according to the period of the voltage change, and the shorter the period, the higher a communication speed.

The reception circuit 110 receives the communication signal Sf input to the communication unit 11 and outputs the communication signal Sf to the communication signal processing unit 112. The communication signal processing unit 112 decodes communication data included in the communication signal Sf received by the reception circuit 110, acquires communication quality information Qf from the communication signal Sf, and outputs these pieces of information to the signal processing unit 12. The communication quality information Qf is information related to communication quality of the communication signal Sf, and is, for example, an error frequency of communication data.

The communication unit 11 has a communication speed change function 113. The communication speed change function 113 is a function of changing a transmission frequency band of the communication signal Sf by changing a communication speed of the communication signal Sf. For example, in a case where a communication speed of the communication signal Sf transmitted from the electronic device 2 to the signal transmission device 1 changes, the communication unit 11 uses the communication speed change function 113 to change operation of the reception circuit 110 and the communication signal processing unit 112 according to the communication speed. By the above, even when a communication speed of the communication signal Sf changes, the communication unit 11 can decode communication data and acquire the communication quality information Qf. Note that the communication speed change function 113 may be implemented by another method as long as a transmission frequency band of the communication signal Sf can be changed.

The signal processing unit 12 is a portion that performs various types of signal processing on the basis of communication data decoded from the communication signal Sf by the communication signal processing unit 112, and is realized by using, for example, a microcomputer that executes a predetermined program or an integrated circuit such as an LSI, an FPGA, or an ASIC. The signal processing unit 12 includes a filter state determination unit 120 as a part of its function. The filter state determination unit 120 determines a state of the filter circuit 14 on the basis of the communication quality information Qf and performs processing according to a determination result. Details of a method of determining a state of the filter circuit 14 by the filter state determination unit 120 will be described later.

The power supply unit 13 generates direct current Id using power supply voltage Vo input from the outside, and outputs the generated direct current Id to the signal wiring 4 via the filter circuit 14. By the above, the direct current Id is superimposed on the communication signal Sf in the signal wiring 4, and current flows in a direction from the signal transmission device 1 to the electronic device 2. As a result, the direct current Id is supplied to the electronic device 2 via the signal wiring 4. A signal processing unit 30 performs various arithmetic processing based on a signal received by a communication circuit unit 31C, for example, processing related to automatic driving of a vehicle based on an image signal.

The filter circuit 14 is connected between the signal wiring 4 and the power supply unit 13, and is configured by connection of inductors L1 and L2 in series. The filter circuit 14 functions as a low-pass filter (PoC filter) that transmits the direct current Id output from the power supply unit 13 and blocks the communication signal Sf transmitted from the electronic device 2 via the signal wiring 4. In the filter circuit 14, the inductor L1 and the inductor L2 function as filters having frequency characteristics different from each other.

Note that, in the example of FIG. 1, the filter circuit 14 is constituted by two of the inductors L1 and L2, but the number of inductors constituting the filter circuit 14 is not limited to this, and the filter circuit 14 may be constituted by three or more inductors. Further, the filter circuit 14 may be configured using a component other than an inductor. If a plurality of filters having frequency characteristics different from each other can be combined to realize a PoC filter that transmits the direct current Id and blocks the communication signal Sf, the filter circuit 14 can be configured using an optional number of filters in an optional system.

The capacitor 15 is connected between the signal wiring 4 and the communication unit 11, and functions as a high-pass filter that transmits the communication signal Sf transmitted from the electronic device 2 via the signal wiring 4 and blocks the direct current Id output from the power supply unit 13.

Figure 2:
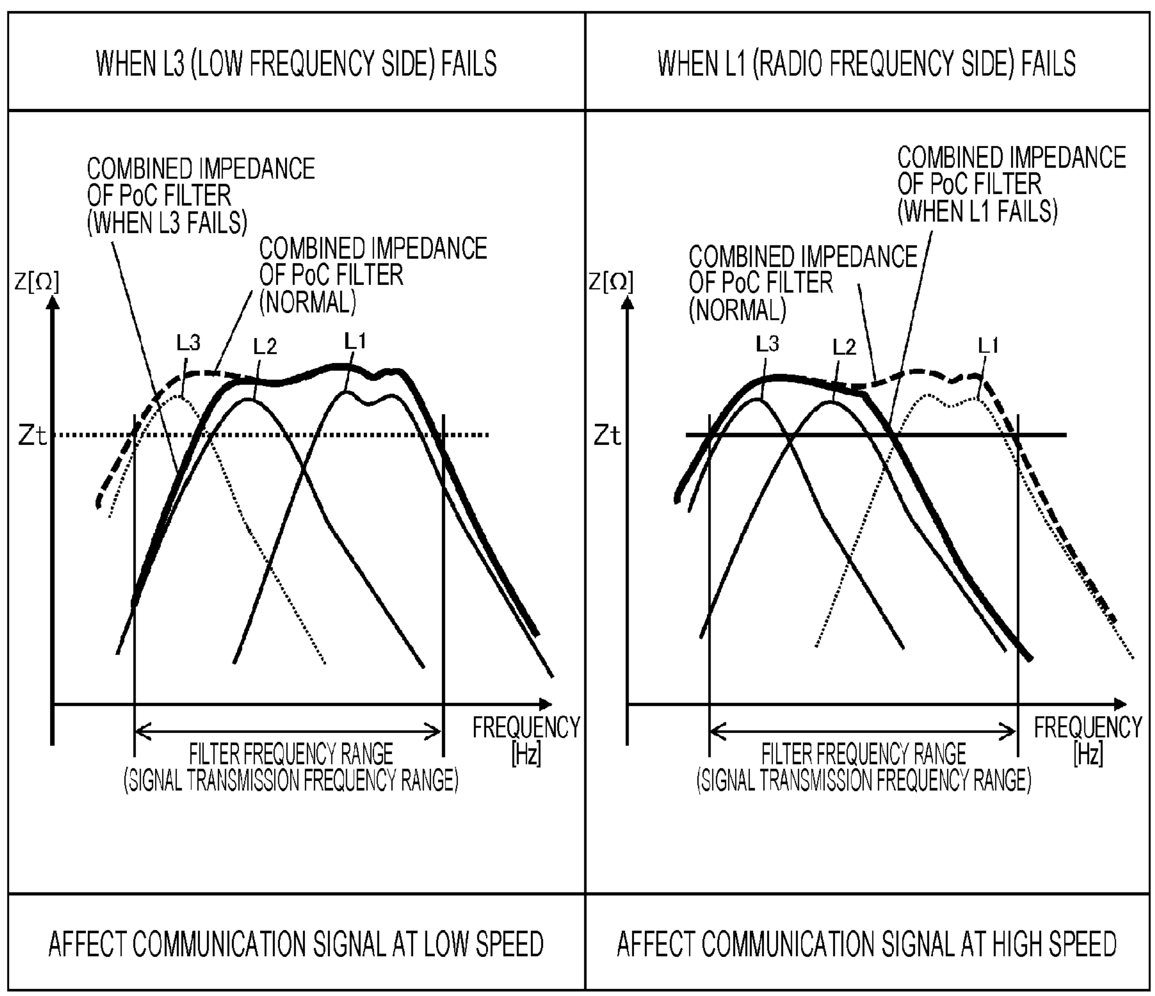
FIG. 2 is a diagram for explaining a change in impedance of the signal transmission device when a filter circuit fails.
Figure 3:
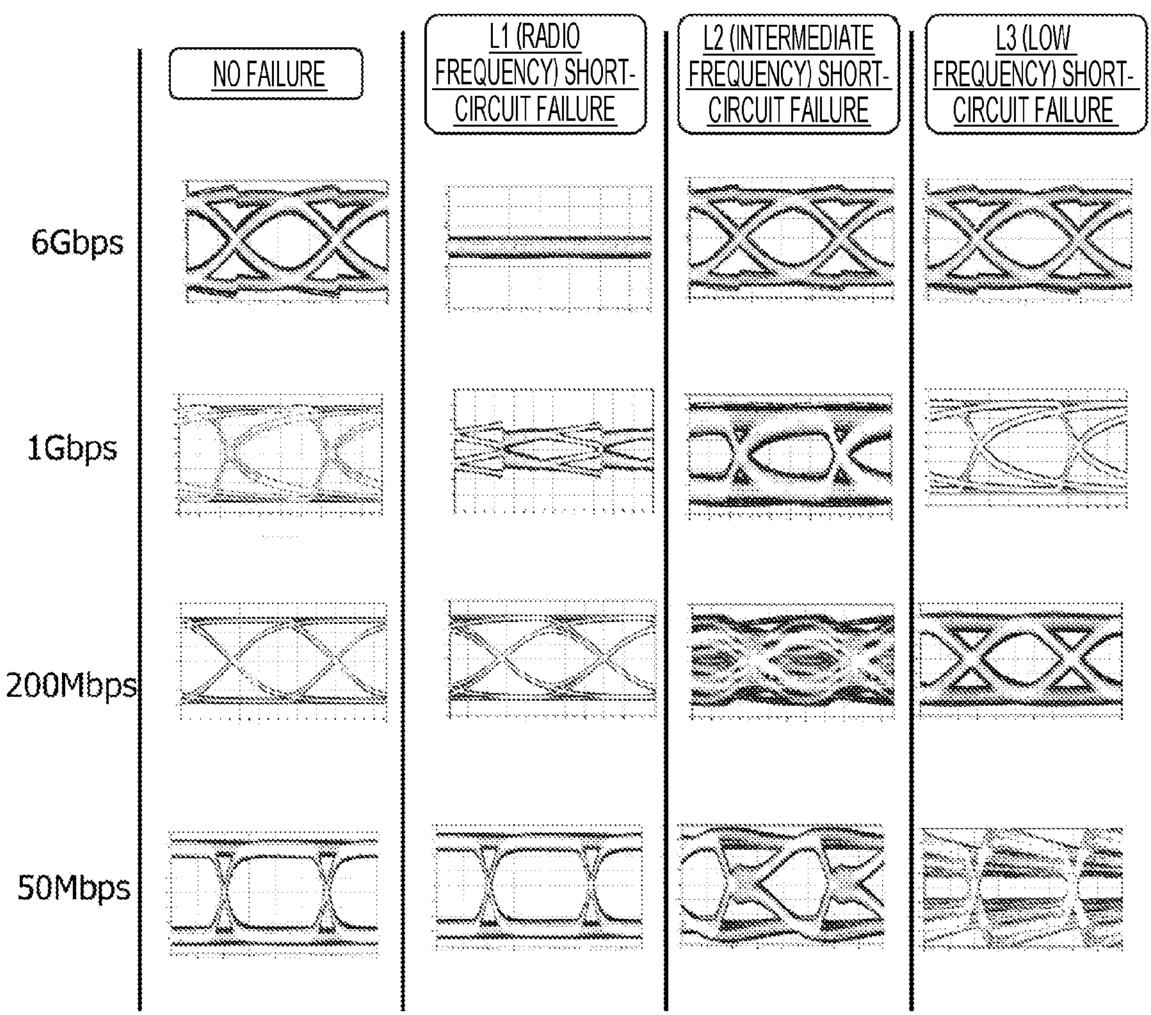
FIG. 3 is a diagram illustrating a relationship between a failure portion of the filter circuit and a communication signal waveform.

Next, an outline of the present invention will be described with reference to FIGS. 2 and 3. FIG. 2 is a diagram for explaining a change in impedance of the signal transmission device 1 when the filter circuit 14 fails. FIG. 3 is a diagram illustrating a relationship between a failure portion of the filter circuit 14 and a signal waveform of the communication signal Sf. Note that FIGS. 2 and 3 illustrate an example of a case where the filter circuit 14 includes three of the inductors L1, L2, and L3 connected in series, and the inductor L1 corresponds to a radio frequency band, the inductor L2 corresponds to an intermediate frequency band, and the inductor L3 corresponds to a low frequency band in a frequency range in which the filter circuit 14 blocks the communication signal Sf.

In FIG. 2, the diagram on the left side illustrates a change in impedance of the filter circuit 14 in a case where a short-circuit fault occurs in the inductor L3 on the low frequency side. As illustrated in this diagram, when the inductor L3 does not have a short-circuit fault, impedance profiles of the inductors L1, L2, and L3 are combined so that impedance of the filter circuit 14 is equal to or more than a predetermined reference value Zt over the entire frequency range to be blocked by the filter circuit 14. On the other hand, when a short-circuit failure occurs in the inductor L3, an impedance profile of the inductor L3 disappears, and impedance of the filter circuit 14 becomes less than the reference value Zt on the low frequency side. As a result, the communication signal Sf leaks to the power supply unit 13 side in the low frequency band, a signal waveform of the communication signal Sf is disturbed, and communication quality of the communication signal Sf deteriorates. This influence is particularly noticeable in a case where a communication speed of the communication signal Sf is low.

In FIG. 2, the diagram on the right side illustrates a change in impedance of the filter circuit 14 in a case where a short-circuit fault occurs in the inductor L1 on the radio frequency side. As illustrated in this diagram, when the inductor L1 does not have a short-circuit fault, impedance profiles of the inductors L1, L2, and L3 are combined so that impedance of the filter circuit 14 is equal to or more than a predetermined reference value Zt over the entire frequency range to be blocked by the filter circuit 14. On the other hand, when a short-circuit failure occurs in the inductor L1, an impedance profile of the inductor L1 disappears, and impedance of the filter circuit 14 becomes less than the reference value Zt on the radio frequency side. As a result, the communication signal Sf leaks to the power supply unit 13 side in the radio frequency band, a signal waveform of the communication signal Sf is disturbed, and communication quality of the communication signal Sf deteriorates. This influence is particularly noticeable in a case where a communication speed of the communication signal Sf is high.

FIG. 3 illustrates an example of a signal waveform of the communication signal Sf received by the communication unit 11 in a case where there is no failure in the filter circuit 14 and in a case where there is a short-circuit failure in each of the inductors L1, L2, and L3 in the filter circuit 14 for each of cases where a communication speed of the communication signal Sf is 6 Gbps, 1 Gbps, 200 Mbps, and 50 Mbps. In FIG. 3, for example, in a case where the inductor L1 fails, signal waveforms of 6 Gbps and 1 Gbps are abnormal, and it can be seen that communication quality of the communication signal Sf deteriorates at these communication speeds. On the other hand, for example, in a case where the inductor L3 fails, signal waveforms of 200 Mbps and 50 Mbps are abnormal, and it can be seen that communication quality of the communication signal Sf is deteriorated at these communication speeds. Further, in a case where the inductor L2 fails, signal waveforms of 1 Gbps, 200 Mbps, and 50 Mbps are abnormal, and it can be seen that communication quality of the communication signal Sf is deteriorated at these communication speeds. In particular, at 200 Mbps, a signal waveform greatly changes as compared with a case where the inductor L1 or the inductor L3 fails, and it can be seen that degree of deterioration of communication quality is large.

In the present invention, the filter state determination unit 120 determines a state of the filter circuit 14 in consideration of a difference in degree of influence on communication quality for each frequency in a case where a short-circuit fault occurs in each inductor constituting the filter circuit 14 as described above. Specifically, the communication quality information Qf when a communication speed of the communication signal Sf is changed using the communication speed change function 113 of the communication unit 11 is acquired, and in a case where communication quality is deteriorated at any of the communication speeds, a short-circuit failure is determined to occur in a filter corresponding to the communication speed in the filter circuit 14.

For example, in a case where the filter circuit 14 includes two of the inductors L1 and L2 as illustrated in FIG. 1, the communication unit 11 receives the communication signal Sf transmitted at a communication speed corresponding to a frequency band of the inductor L1 and the communication signal Sf transmitted at a communication speed corresponding to a frequency band of the inductor L2, and acquires the communication quality information Qf of each of the signals. The filter state determination unit 120 determines whether communication quality is deteriorated based on each piece of the acquired communication quality information Qf, and, in a case where communication quality is deteriorated at any of the communication speeds, the filter state determination unit 120 determines that a short-circuit fault occurs in one of the inductors L1 and L2 corresponding to the communication speed. In this manner, a state of the filter circuit 14 can be determined on the basis of the communication quality information Qf.

Note that, in the above description, the number of times of changing a communication speed of the communication signal Sf is preferably equal to or larger than at least the number of filters constituting the filter circuit 14. If a communication speed corresponding to a frequency characteristic of each filter of the filter circuit 14 can be sufficiently covered, the communication quality information Qf can be acquired by changing a communication speed of the communication signal Sf an optional number of times.

Figure 4:
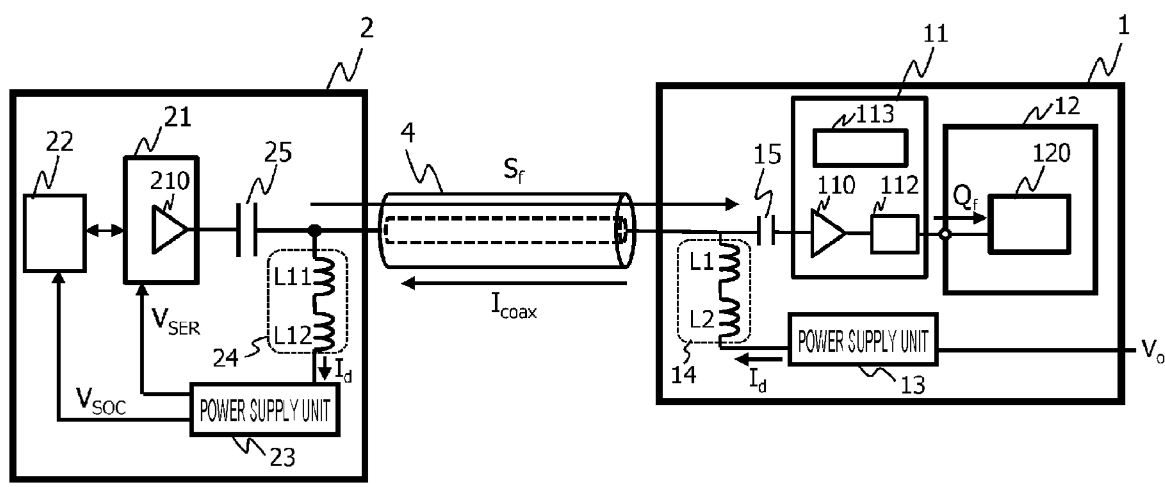
FIG. 4 is a diagram illustrating a configuration of a signal transmission system according to the first embodiment of the present invention.

FIG. 4 is a diagram illustrating a configuration of a signal transmission system according to the first embodiment of the present invention. The signal transmission system illustrated in FIG. 4 is configured such that the signal transmission device 1 and the electronic device 2 described in FIG. 1 are connected to each other via the signal wiring 4, and a signal is transmitted between the signal transmission device 1 and the electronic device 2 via the signal wiring 4. In the present embodiment, the signal wiring 4 is configured using, for example, a coaxial cable. Note that, hereinafter, signal transmission is assumed to be performed from the electronic device 2 to the signal transmission device 1, but conversely, signal transmission may be performed from the signal transmission device 1 to the electronic device 2.

The electronic device 2 is a transmission source of the communication signal Sf received by the signal transmission device 1, and is used in combination with various apparatuses and devices. The electronic device 2 is mounted on, for example, a camera installed in a vehicle, and transmits an image signal based on image information acquired by the camera to the signal transmission device 1 via the signal wiring 4 as the communication signal Sf. The electronic device 2 includes a communication unit 21, a signal processing unit 22, a power supply unit 23, a filter circuit 24, and a capacitor 25.

The signal processing unit 22 performs various types of signal processing according to application of a device or apparatus on which the electronic device 2 is mounted, and outputs communication data based on a processing result to the communication unit 21. The communication unit 21 includes a transmission circuit 210, converts communication data input to the communication unit 21 into the communication signal Sf, and outputs the communication signal Sf from the transmission circuit 210 to the signal wiring 4 via the capacitor 25. In this manner, the communication signal Sf is transmitted from the electronic device 2 to the signal transmission device 1 via the signal wiring 4.

The filter circuit 24 is connected between the signal wiring 4 and the power supply unit 23, and is configured by connection of inductors L11 and L12 in series. The filter circuit 24 functions as a low-pass filter (PoC filter) that transmits the direct current Id supplied from the signal transmission device 1 via the signal wiring 4 and blocks the communication signal Sf transmitted from the communication unit 21. In the filter circuit 24, the inductors L11 and L12 correspond to the inductors L1 and L2 of the filter circuit 14 in the signal transmission device 1, respectively, and have frequency characteristics similar to frequency characteristics of the inductors L1 and L2, respectively.

Note that, in the example of FIG. 4, the filter circuit 24 is constituted by two of the inductors L11 and L12, but the number of inductors constituting the filter circuit 24 is not limited to this, and the filter circuit 24 may be configured using three or more inductors, similarly to the filter circuit 14 of the signal transmission device 1. Further, the filter circuit 24 may be configured using a component other than an inductor. If a plurality of filters having frequency characteristics different from each other can be combined to realize a PoC filter that transmits the direct current Id and blocks the communication signal Sf, the filter circuit 24 can be configured using an optional number of filters in an optional system.

The power supply unit 23 receives the direct current Id supplied from the signal transmission device 1 via the signal wiring 4 and passes through the filter circuit 24, and uses the direct current Id to supply power supplies Vser and Vsoc to the communication unit 21 and the signal processing unit 22, respectively.

The capacitor 25 is connected between the signal wiring 4 and the communication unit 21, and functions as a high-pass filter that transmits the communication signal Sf output from the communication unit 21 and blocks the direct current Id supplied from the signal transmission device 1 via the signal wiring 4.

In the signal transmission system of FIG. 4, the electronic device 2 causes the communication unit 21 to transmit the communication signal Sf at a communication speed in a frequency band corresponding to frequency characteristics of the inductors L1 and L11 and a communication speed in a frequency band corresponding to frequency characteristics of the inductors L2 and L12. The communication signal Sf transmitted from the electronic device 2 is input to the signal transmission device 1 via the signal wiring 4 and received by the reception circuit 110 in the communication unit 11. Then, the communication quality information Qf of the communication signal Sf obtained in each frequency band is output from the communication signal processing unit 112 and input to the signal processing unit 12.

In the signal processing unit 12, the filter state determination unit 120 determines states of the filter circuit 14 in the signal transmission device 1 and the filter circuit 24 in the electronic device 2 by determining whether the communication signal Sf in each frequency band is normal or abnormal from the communication quality information Qf. That is, in a case where there is an abnormality in the communication signal Sf in the frequency band corresponding to the frequency characteristics of the inductors L1 and L11, at least one of the inductors L1 and L11 is determined to have a short-circuit fault. On the other hand, in a case where there is an abnormality in the communication signal Sf in the frequency band corresponding to the frequency characteristics of the inductors L2 and L12, at least one of the inductors L2 and L12 is determined to have a short-circuit fault. By the above, in a case where a short-circuit fault occurs in the filter circuits 14 and 24, the fault can be reliably detected on the signal transmission device 1 side.

Note that, in the signal transmission device 1, an operation mode of the electronic device 2 may be changed on the basis of the above-described state determination results of the filter circuits 14 and 24. For example, in a case where a short-circuit fault is determined to occur in at least one of the inductors L1 and L11 on the radio frequency side, the electronic device 2 is operated in a function stop mode in which a part of functions of the electronic device 2 is stopped or in a function degeneration mode in which a part of functions of the electronic device 2 is limited so that the signal processing unit 22 does not perform processing of transmitting the communication signal Sf at a communication speed on the high-speed side. On the other hand, in a case where a short-circuit fault is determined to occur in at least one of the inductors L2 and L12 on the low frequency side, the electronic device 2 is operated in a function stop mode in which a part of functions of the electronic device 2 is stopped or in a function degeneration mode in which a part of functions of the electronic device 2 is limited so that the signal processing unit 22 does not perform processing of transmitting the communication signal Sf at a communication speed on the low-speed side. In this way, even in a case where a part of the filter circuits 14 and 24 fails, operation of the electronic device 2 can be continued within a possible range.

According to the first embodiment of the present invention described above, an action and an effect described below are achieved.

(1) The signal transmission device 1 includes the communication unit 11 that is connected to the electronic device 2 via the signal wiring 4 and performs communication with the electronic device 2 via the signal wiring 4, the signal processing unit 12 that performs signal processing related to communication performed by the communication unit 11, the power supply unit 13 that supplies the direct current Id to the electronic device 2 via the signal wiring 4, and the filter circuit 14 connected between the signal wiring 4 and the power supply unit 13. The filter circuit 14 includes a plurality of filters (the inductors L1 and L2) having frequency characteristics different from each other. The signal processing unit 12 acquires the communication quality information Qf indicating quality of communication in at least two or more frequency bands, and determines a state of the filter circuit 14 on the basis of the communication quality information Qf. With this configuration, it is possible to detect a failure of the filter circuit 14 used as a PoC filter.

(2) The communication unit 11 receives the communication signal Sf transmitted from the electronic device 2 in a first frequency band and the communication signal Sf transmitted from the electronic device 2 in a second frequency band different from the first frequency band. The signal processing unit 12 determines a state of the filter circuit 14 on the basis of the communication quality information Qf in the first frequency band and the communication quality information Qf in the second frequency band. With this configuration, when a short-circuit fault occurs in the inductors L1 and L2 that are filters constituting the filter circuit 14, the fault can be reliably detected.

(3) An operation mode of the electronic device 2 may be changed on the basis of a determination result of a state of the filter circuit 14 by the signal processing unit 12. In this way, even in a case where the filter circuit 14 fails, operation of the electronic device 2 can be continued as much as possible to improve availability of the electronic device 2.

(4) The electronic device 2 includes the communication unit 21 that performs communication with the signal transmission device 1 that is an electronic device via the signal wiring 4, the signal processing unit 22 that performs signal processing related to communication performed by the communication unit 21, the power supply unit 23 that supplies the power supplies Vser and Vsoc to the communication unit 21 and the signal processing unit 22 using the direct current Id supplied from the signal transmission device 1 via the signal wiring 4, and the filter circuit 24 connected between the signal wiring 4 and the power supply unit 23. Each of the filter circuit 14 and the filter circuit 24 includes a plurality of filters (inductors L1, L2, L11, and L12) having frequency characteristics different from each other. The signal processing unit 12 acquires the communication quality information Qf indicating quality of communication in at least two or more frequency bands, and determines a state of the filter circuit 14 and the filter circuit 24 on the basis of the communication quality information Qf. With this configuration, in the signal transmission system including the signal transmission device 1 and the electronic device 2, it is possible to detect failure of the filter circuits 14 and 24 used as PoC filters.

Second Embodiment

Next, a signal transmission device and a signal transmission system according to a second embodiment of the present invention will be described. In the present embodiment, an example in which a signal transmission device 1A and an electronic device 2A connected via the signal wiring 4 perform bidirectional communication with each other will be described. Note that the signal transmission device 1A and the electronic device 2A of the present embodiment correspond to the signal transmission device 1 and the electronic device 2 described in the first embodiment, respectively, and have partially different configurations. Hereinafter, the signal transmission device 1A and the electronic device 2A will be described focusing on differences from the first embodiment.

Figure 5:
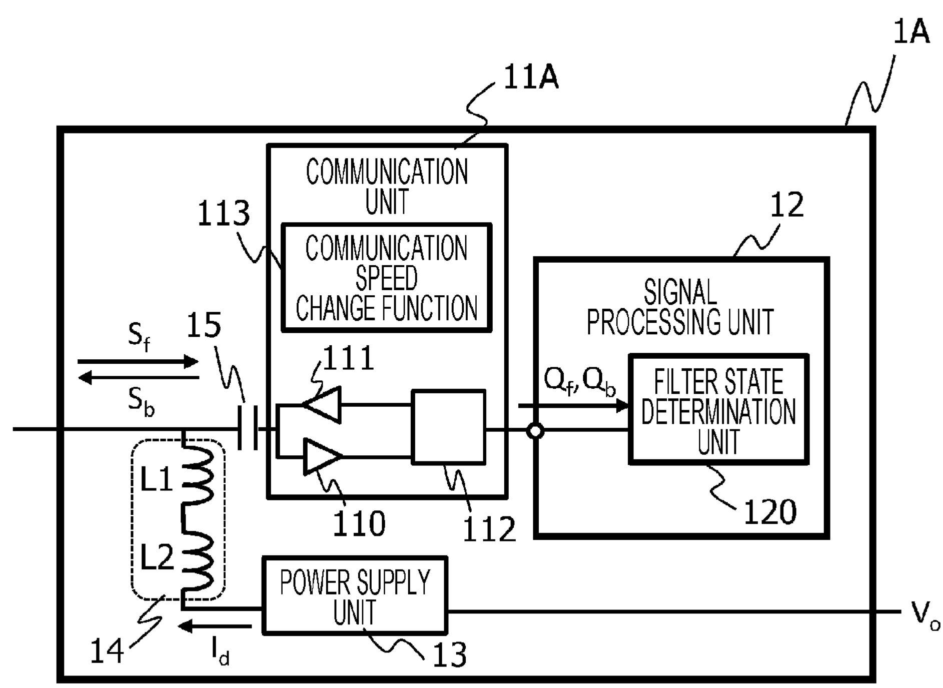
FIG. 5 is a diagram illustrating a configuration of the signal transmission device according to a second embodiment of the present invention.

FIG. 5 is a diagram illustrating a configuration of the signal transmission device 1A according to the second embodiment of the present invention. As illustrated in FIG. 5, the signal transmission device 1A of the present embodiment has the same configuration as the signal transmission device 1 of the first embodiment described in FIG. 1 except that a communication unit 11A is provided instead of the communication unit 11. In the present embodiment, communication data to the electronic device 2A is input from the signal processing unit 12 to the communication unit 11A. The communication data includes, for example, control data for controlling operation of the electronic device 2A.

The communication unit 11A further includes a transmission circuit 111 in addition to the reception circuit 110, the communication signal processing unit 112, and the communication speed change function 113 described in the first embodiment. In the communication unit 11A, the communication signal processing unit 112 generates communication data from the communication signal Sf received by the reception circuit 110 and outputs the communication data to the signal processing unit 12, and converts communication data input from the signal processing unit 12 into a communication signal Sb and outputs the communication signal Sb to the transmission circuit 111. The transmission circuit 111 transmits the communication signal Sb by outputting the communication signal Sb to the signal wiring 4 via the capacitor 25. By the above, the communication signal Sb in a predetermined frequency band is transmitted from the signal transmission device 1A to the electronic device 2A (see FIG. 6) via the signal wiring 4.

Similarly to the communication signal Sf, the communication signal Sb is a serial signal representing "1" and "0" of data by, for example, a voltage difference, and voltage changes every predetermined period. A communication speed of the communication signal Sb is determined according to the period of the voltage change, and the shorter the period, the higher a communication speed. Note that a communication speed of the communication signal Sb is set according to a necessary communication data amount and communication frequency, and may be the same as or different from a communication speed of the communication signal Sf.

Figure 6:
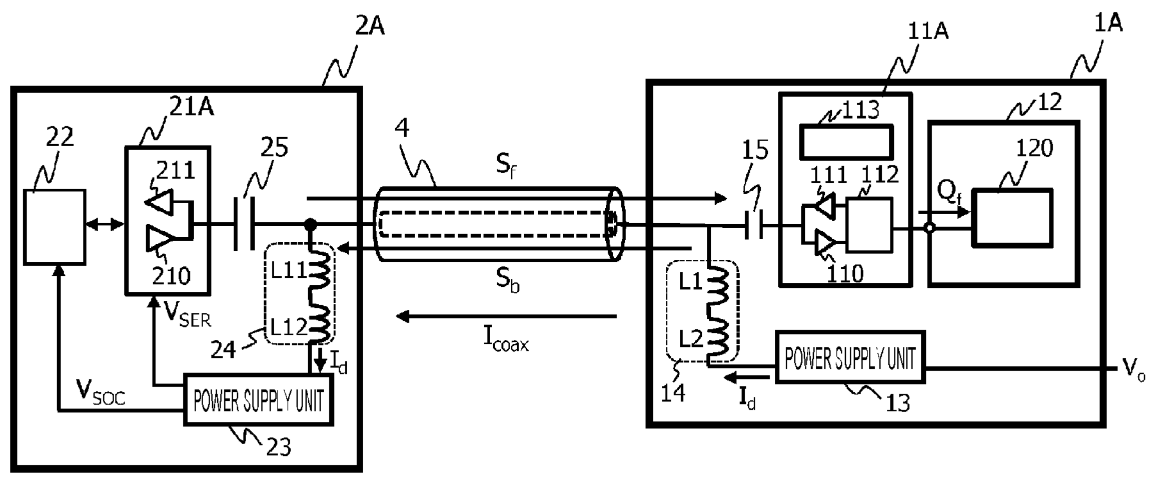
FIG. 6 is a diagram illustrating a configuration of the signal transmission system according to the second embodiment of the present invention.

FIG. 6 is a diagram illustrating a configuration of the signal transmission system according to the second embodiment of the present invention. The signal transmission system illustrated in FIG. 6 is configured such that the signal transmission device 1A and the electronic device 2A described in FIG. 5 are connected to each other via the signal wiring 4, and a signal is transmitted between the signal transmission device 1A and the electronic device 2A via the signal wiring 4.

As illustrated in FIG. 6, the electronic device 2A of the present embodiment has the same configuration as the electronic device 2 of the first embodiment described with reference to FIG. 4 except that a communication unit 21A is provided instead of the communication unit 21. In the present embodiment, the communication signal Sb transmitted from the signal transmission device 1A to the electronic device 2A is input to the communication unit 21A via the capacitor 25.

The communication unit 21A further includes a reception circuit 211 in addition to the transmission circuit 210 described in the first embodiment. The reception circuit 211 receives the communication signal Sb input to the communication unit 21A. The communication signal Sb received by the reception circuit 211 is decoded into communication data in the communication unit 21A, and is output to the signal processing unit 22. By the above, communication data based on the communication signal Sb is used in signal processing performed by the signal processing unit 22.

In the signal transmission system of FIG. 6, similarly to the electronic device 2 described in the first embodiment, the electronic device 2A causes the communication unit 21A to transmit the communication signal Sf at a communication speed in a frequency band corresponding to frequency characteristics of the inductors L1 and L11 and a communication speed in a frequency band corresponding to frequency characteristics of the inductors L2 and L12. The communication signal Sf transmitted from the electronic device 2A is input to the signal transmission device 1A via the signal wiring 4 and received by the reception circuit 110 in the communication unit 11A. Then, the communication quality information Qf of the communication signal Sf obtained in each frequency band is output from the communication signal processing unit 112 and input to the signal processing unit 12. In the signal processing unit 12, the filter state determination unit 120 determines states of the filter circuit 14 in the signal transmission device 1A and the filter circuit 24 in the electronic device 2A by determining whether the communication signal Sf in each frequency band is normal or abnormal from the communication quality information Qf.

According to the second embodiment of the present invention described above, the communication unit 11A has a bidirectional communication function of receiving the communication signal Sf transmitted from the electronic device 2A and transmitting the communication signal Sb to the electronic device 2A. With this configuration, the electronic device 2A can perform various pieces of signal processing using the communication signal Sb transmitted from the signal transmission device 1A.

Third Embodiment

Next, a signal transmission device and a signal transmission system according to a third embodiment of the present invention will be described. In the present embodiment, an example in which a signal transmission device 1B and an electronic device 2B connected via the signal wiring 4 perform bidirectional communication with each other, and a state of a filter circuit is determined using the communication quality information Qf and Qb in the respective communication signals Sf and Sb will be described. Note that the signal transmission device 1B and the electronic device 2B of the present embodiment correspond to the signal transmission device 1A and the electronic device 2A described in the second embodiment, respectively, and have partially different configurations. Hereinafter, the signal transmission device 1B and the electronic device 2B will be described focusing on differences from the second embodiment.

Figure 7:
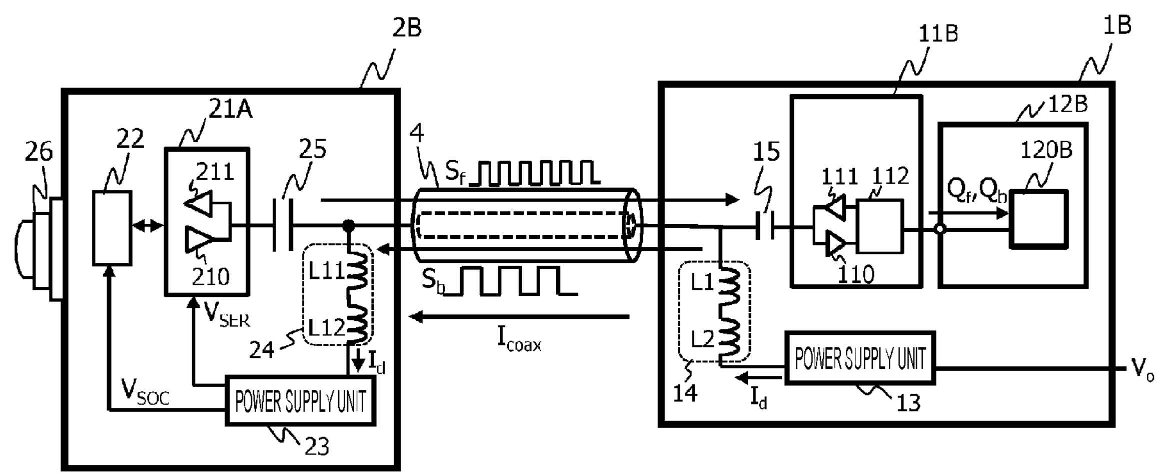
FIG. 7 is a diagram illustrating a configuration of the signal transmission system according to a third embodiment of the present invention.

FIG. 7 is a diagram illustrating a configuration of the signal transmission system according to the third embodiment of the present invention. The signal transmission system illustrated in FIG. 7 is configured such that the signal transmission device 1B and the electronic device 2B are connected to each other via the signal wiring 4, and a signal is transmitted between the signal transmission device 1B and the electronic device 2B via the signal wiring 4. Note that, in the present embodiment, the communication signal Sf and the communication signal Sb have different communication speeds. Hereinafter, the communication signal Sb is assumed to have a lower communication speed than the communication signal Sf, but conversely, the communication signal Sb may have a higher communication speed than the communication speed Sf.

As illustrated in FIG. 7, the signal transmission device 1B of the present embodiment includes a communication unit 11B and a signal processing unit 12B. The communication unit 11B has the same configuration as the communication unit 11A in the signal transmission device 1A of the second embodiment described with reference to FIGS. 5 and 6 except that the communication speed change function 113 is not included. The signal processing unit 12B has the same configuration as the signal processing unit 12 in the signal transmission device 1 of the first embodiment described with reference to FIGS. 1 and 4 except that a filter state determination unit 120B is included instead of the filter state determination unit 120.

In the communication unit 11B, the communication signal processing unit 112 acquires the communication quality information Qb of the communication signal Sb in addition to the communication quality information Qf of the communication signal Sf, and outputs the communication quality information Qb to the signal processing unit 12B. The communication quality information Qb is information related to communication quality of the communication signal Sb, and is, for example, an error frequency of communication data. The communication signal processing unit 112 can acquire the communication quality information Qb of the communication signal Sb as information included in the communication signal Sf transmitted from the electronic device 2B, for example.

As illustrated in FIG. 7, the electronic device 2B of the present embodiment further includes a camera unit 26 in addition to the same configuration as the electronic device 2A of the second embodiment described with reference to FIGS. 5 and 6. The camera unit 26 is configured using a lens or an image sensor, and generates an image signal as the image sensor captures a subject image formed on the image sensor by the lens. The image signal generated by the camera unit 26 is input to the signal processing unit 22, and after predetermined signal processing is performed in the signal processing unit 22, the image signal is output to the communication unit 21A as communication data to the signal transmission device 1B. By the above, an image signal acquired by the camera unit 26 is transmitted from the electronic device 2B to the signal transmission device 1B.

For example, in a case where the electronic device 2B is mounted on a vehicle, as an image of a surrounding environment of the vehicle is captured using the camera unit 26, the electronic device 2B can detect the surrounding environment of the vehicle and transmit the communication signal Sf including an image signal related to a detection result to the signal transmission device 1B.

Further, in the electronic device 2B, the communication unit 21A acquires the communication quality information Qb from the communication signal Sb received from the signal transmission device 1B. The communication quality information Qb of the communication signal Sb acquired by the communication unit 21A is notified from the electronic device 2B to the signal transmission device 1B. For example, the communication quality information Qb can be notified from the electronic device 2B to the signal transmission device 1B as the communication signal Sf including the communication quality information Qb is transmitted from the electronic device 2B to the signal transmission device 1B. Alternatively, the communication quality information Qb may be notified using another method, for example, a communication path different from the communication signal Sf.

In the signal transmission system of FIG. 7, the electronic device 2B transmits the communication signal Sf at a communication speed in a frequency band on the radio frequency side according to frequency characteristics of the inductors L1 and L11 by the communication unit 21A. The communication signal Sf transmitted from the electronic device 2B is input to the signal transmission device 1B via the signal wiring 4 and received by the reception circuit 110 in the communication unit 11B. Then, the communication quality information Qf of the communication signal Sf is output from the communication signal processing unit 112 and input to the signal processing unit 12B.

On the other hand, the signal transmission device 1B causes the communication unit 11B to transmit the communication signal Sb at a communication speed in a frequency band on the low frequency side according to frequency characteristics of the inductors L2 and L12. The communication signal Sb transmitted from the signal transmission device 1B is input to the electronic device 2B via the signal wiring 4, is received by the reception circuit 211 in the communication unit 21A, and the communication quality information Qb of the communication signal Sb is acquired. Then, as described above, the communication quality information Qb of the communication signal Sb is notified from the electronic device 2B to the signal transmission device 1B, and is input to the signal processing unit 12B.

In the signal processing unit 12B, the filter state determination unit 120B determines states of the filter circuit 14 in the signal transmission device 1B and the filter circuit 24 in the electronic device 2B by determining whether the communication signals Sf and Sb are normal or abnormal from the communication quality information Qf and Qb, respectively. That is, in a case where there is an abnormality in the communication signal Sf, at least one of the inductors L1 and L11 is determined to have a short-circuit fault. On the other hand, in a case where there is an abnormality in the communication signal Sb, at least one of the inductors L2 and L12 is determined to have a short-circuit fault. By the above, in a case where a short-circuit fault occurs in the filter circuits 14 and 24, the fault can be reliably detected on the signal transmission device 1B side.

According to the third embodiment of the present invention described above, the communication unit 11B receives the communication signal Sf transmitted from the electronic device 2B in a first frequency band, and transmits the communication signal Sb to the electronic device 2B in a second frequency band different from the first frequency band. The signal processing unit 12B determines states of the filter circuits 14 and 24 based on the communication quality information Qf in the first frequency band and the communication quality information Qb in the second frequency band. With this configuration, even if the communication unit 11B does not have a communication speed change function, the signal transmission device 1B can determine states of the filter circuits 14 and 24.

Note that, in the third embodiment of the present invention described above, the example in which the electronic device 2B includes the camera unit 26 and detects a surrounding environment of a vehicle using the camera unit 26 is described. However, a sensor other than a camera may be used as the sensor that detects a surrounding environment of a vehicle. For example, the electronic device 2B including various sensors such as a radar, a LiDAR, and a sonar is mounted on a vehicle, and the communication signal Sf including information regarding a surrounding environment of a vehicle detected using these sensors can be transmitted from the electronic device 2B to the signal transmission device 1B, and the communication signal Sb including control information for controlling operation of these sensors can be transmitted from the signal transmission device 1B to the electronic device 2B.

Fourth Embodiment

Next, a signal transmission device and a signal transmission system according to a fourth embodiment of the present invention will be described. In the present embodiment, an example in which a state of a filter circuit is determined on the basis of a supply state of the direct current Id from a signal transmission device 1C to the electronic device 2B will be described. Note that the signal transmission device 1C of the present embodiment corresponds to the signal transmission device 1B described in the third embodiment, and is partially different in configuration. Hereinafter, the signal transmission device 1C will be described focusing on differences from the third embodiment.

Figure 8:
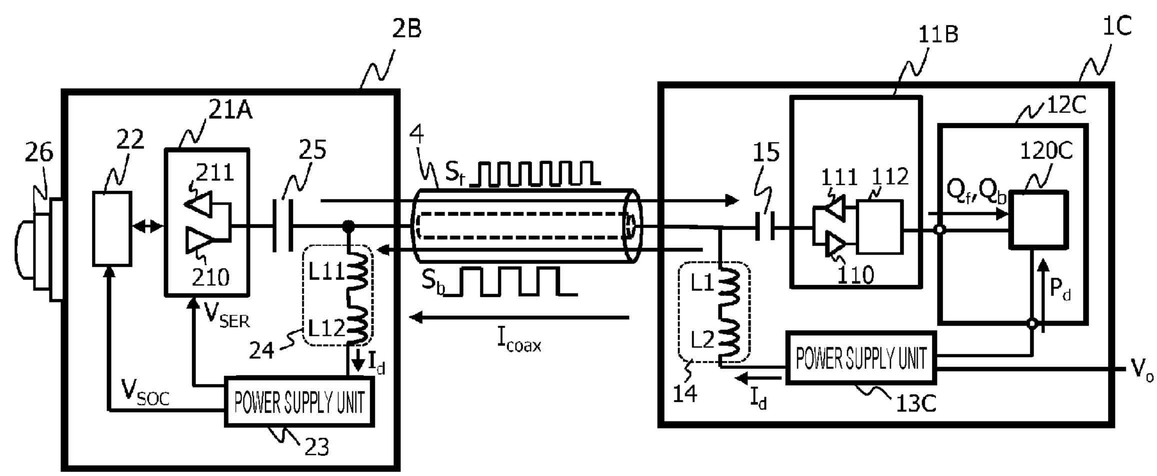
FIG. 8 is a diagram illustrating a configuration of the signal transmission system according to a fourth embodiment of the present invention.

FIG. 8 is a diagram illustrating a configuration of the signal transmission system according to the fourth embodiment of the present invention. The signal transmission system illustrated in FIG. 8 is configured such that the signal transmission device 1C and the electronic device 2B are connected to each other via the signal wiring 4, and a signal is transmitted between the signal transmission device 1C and the electronic device 2B via the signal wiring 4. Note that, in the present embodiment, the electronic device 2B is the same as that described in the third embodiment.

As illustrated in FIG. 8, the signal transmission device 1C of the present embodiment includes a signal processing unit 12C and a power supply unit 13C. The signal processing unit 12C has the same configuration as the signal processing unit 12B in the signal transmission device 1B of the third embodiment described with reference to FIG. 7 except that a filter state determination unit 120C is included instead of the filter state determination unit 120B. The power supply unit 13C outputs the direct current Id to the signal wiring 4 via the filter circuit 14, and outputs power supply information Pd indicating a supply state of the direct current Id to the signal processing unit 12C. For example, information such as a current value of the direct current Id and output voltage of the power supply unit 13C when the direct current Id is output can be used as the power supply information Pd.

The power supply information Pd output from the power supply unit 13C is input to the filter state determination unit 120C in the signal processing unit 12C. The filter state determination unit 120C determines states of the filter circuits 14 and 24 in the same manner as described in the third embodiment, and determines a state of the power supply unit 13C based on the power supply information Pd. Then, a cause of a case where a communication abnormality occurs in the signal transmission system is identified on the basis of these determination results. That is, in a case where a communication abnormality occurs in the signal transmission system, whether any of the filter circuits 14 and 24 fails or the power supply unit 13C fails is determined.

According to the fourth embodiment of the present invention described above, the signal processing unit 12C acquires the power supply information Pd indicating a supply state of the direct current Id in the power supply unit 13C, and determines states of the filter circuits 14 and 24 and the power supply unit 13C based on the communication quality information Qf and Qb and the power supply information Pd. With this configuration, in a case where a communication abnormality occurs in the signal transmission system, a cause of the communication abnormality can be identified.

Fifth Embodiment

Next, a signal transmission device and a signal transmission system according to a fifth embodiment of the present invention will be described. In the present embodiment, an example of communication abnormality determination in a case where the PoC filter includes three inductors will be described.

Figure 9:
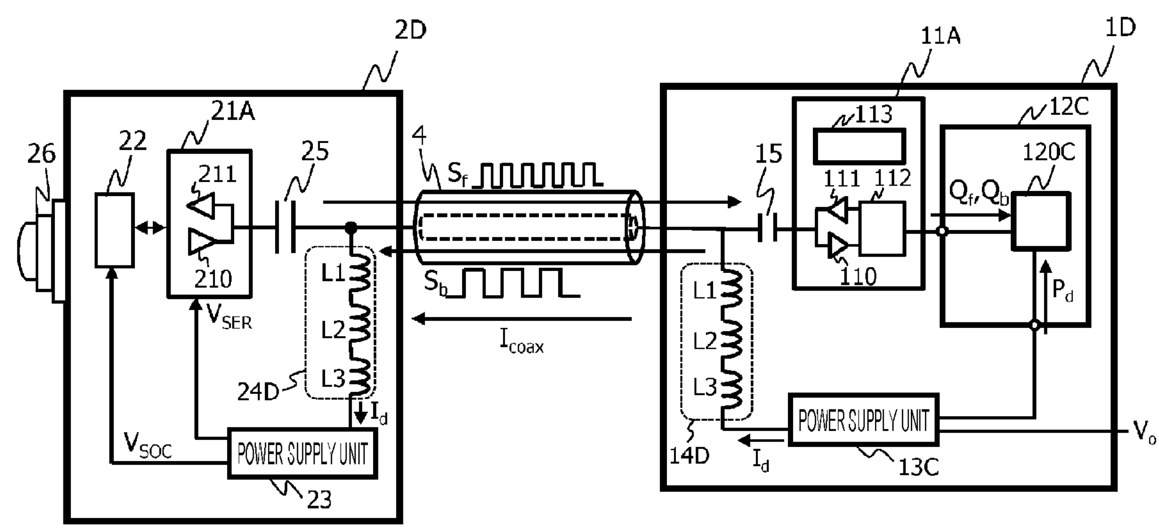
FIG. 9 is a diagram illustrating a configuration of the signal transmission system according to a fifth embodiment of the present invention.

FIG. 9 is a diagram illustrating a configuration of the signal transmission system according to the fifth embodiment of the present invention. The signal transmission system illustrated in FIG. 9 is configured such that a signal transmission device 1D and an electronic device 2D are connected to each other via the signal wiring 4, and a signal is transmitted between the signal transmission device 1D and the electronic device 2D via the signal wiring 4.

As illustrated in FIG. 9, the signal transmission device 1D of the present embodiment includes the communication unit 11A, the signal processing unit 12C, the power supply unit 13C, and a filter circuit 14D. The communication unit 11A is the same as the signal transmission device 1A of the second embodiment described with reference to FIG. 5, and the signal processing unit 12C and the power supply unit 13C are the same as the signal transmission device 1C of the fourth embodiment described with reference to FIG. 8. Further, the electronic device 2D of the present embodiment has the same configuration as the electronic device 2B of the third and fourth embodiments described with reference to FIGS. 7 and 8, respectively, except that a filter circuit 24D is provided instead of the filter circuit 24.

The filter circuits 14D and 24D are configured by connecting three of the inductors L1, L2, and L3 in series. Hereinafter, description will be made by assuming that the inductor L1 corresponds to a radio frequency band, the inductor L2 corresponds to an intermediate frequency band, and the inductor L3 corresponds to a low frequency band in a frequency range in which the filter circuits 14D and 24D block the communication signals Sf and Sb, similarly to the description in FIGS. 2 and 3.

Figure 10:
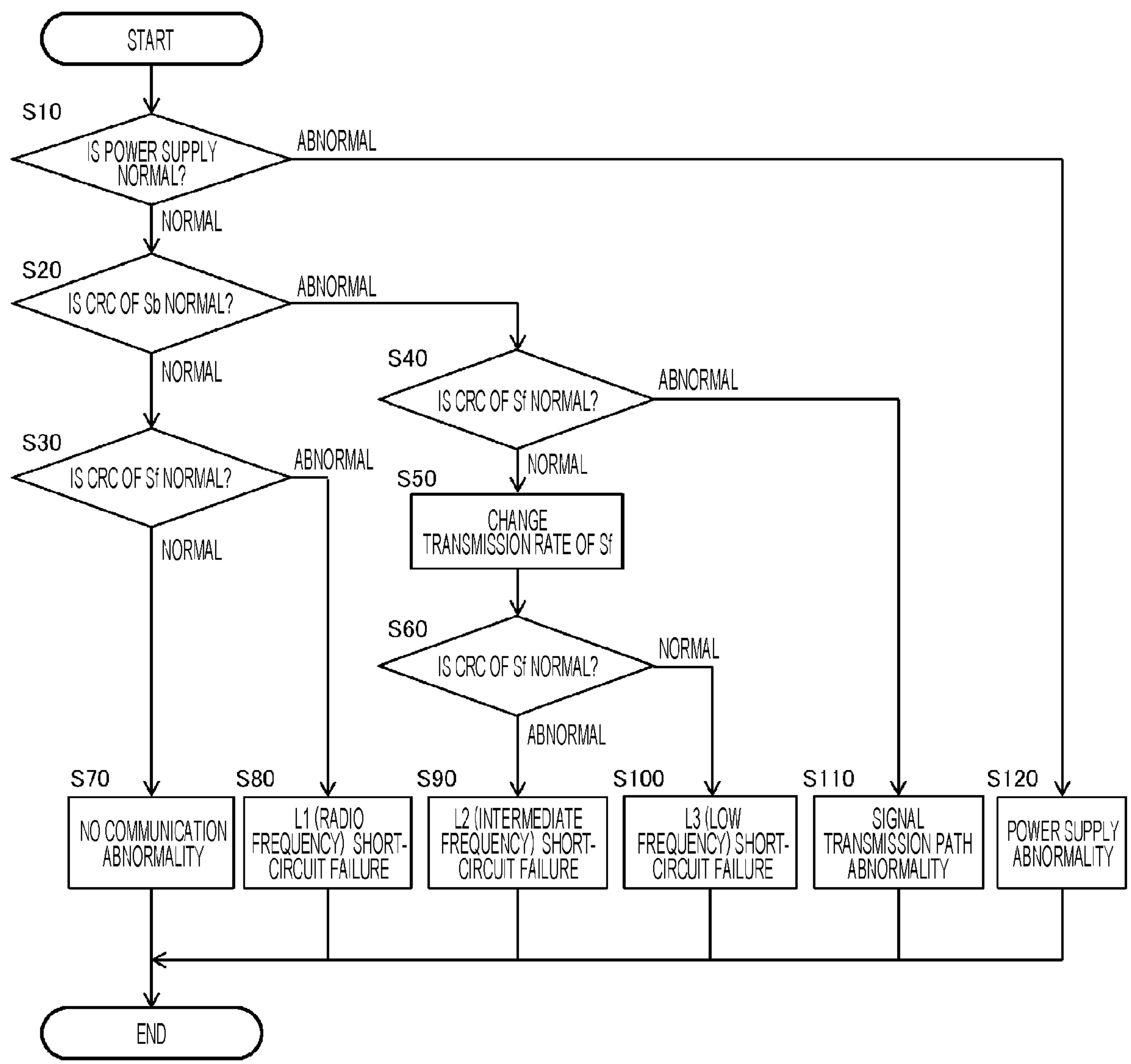
FIG. 10 is a flowchart illustrating a process of communication abnormality determination in the signal transmission system according to the fifth embodiment of the present invention.

FIG. 10 is a flowchart illustrating a process of communication abnormality determination in the signal transmission system according to the fifth embodiment of the present invention. Processing illustrated in the flowchart of FIG. 10 is realized by, for example, a microcomputer executing a predetermined program in the filter state determination unit 120C of the signal transmission device 1D. Alternatively, the processing illustrated in the flowchart of FIG. 10 may be realized using an integrated circuit such as an LSI, an FPGA, or an ASIC.

In Step S10, whether or not a supply state of the direct current Id from the power supply unit 13C to the electronic device 2D is normal on the basis of the power supply information Pd. In a case where a supply state of the direct current Id is normal, the processing proceeds to Step S20, and in a case where the supply state is abnormal, the processing proceeds to Step S120.

In Step S20, whether or not communication quality of the communication signal Sb is normal is determined based on the communication quality information Qb. Here, as the communication quality information Qb, a result of determination in the electronic device 2D as to whether or not a value of a cyclic redundancy code (CRC) of communication data included in the communication signal Sb is normal is acquired, and whether or not communication quality of the communication signal Sb is normal is determined from the determination result. In a case where the communication quality of the communication signal Sb is normal, the processing proceeds to Step S30, and in a case where the communication quality is abnormal, the processing proceeds to Step S40.

In Step S30, whether or not communication quality of the communication signal Sf is normal on the basis of the communication quality information Qf. Here, a CRC of communication data included in the communication signal Sf is acquired as the communication quality information Qf, and whether or not a value of the CRC is normal is determined, so that whether or not communication quality of the communication signal Sf is normal is determined. In a case where the communication quality of the communication signal Sf is normal, the processing proceeds to Step S70, and in a case where the communication quality is abnormal, the processing proceeds to Step S80.

In Step S40, similarly to Step S30, whether or not communication quality of the communication signal Sf is normal based on the communication quality information Qf. In a case where the communication quality of the communication signal Sf is normal, the processing proceeds to Step S50, and in a case where the communication quality is abnormal, the processing proceeds to Step S110.

In Step S50, a transmission rate (communication speed) of the communication signal Sf is changed using the communication speed change function 113 of the communication unit 11A. Here, a transmission rate of the communication signal Sf is changed from high speed to low speed, for example, from 6 Gbps to 1 Gbps. By the above, a communication speed of the communication signal Sf is changed from a communication speed corresponding to a frequency band of the inductor L1 to a communication speed corresponding to a frequency band of the inductor L2.

In Step S60, it is determined whether or not communication quality of the communication signal Sf is normal based on the communication quality information Qf acquired for the communication signal Sf whose transmission rate is changed in Step S50. In a case where the communication quality of the communication signal Sf is normal, the processing proceeds to Step S100, and in a case where the communication quality is abnormal, the processing proceeds to Step S90.

In Step S70, there is determined to be no communication abnormality.

In Step S80, the inductor L1 is determined to have a short-circuit fault in at least one of the filter circuits 14 and 24.

In Step S90, the inductor L2 is determined to have a short-circuit fault in at least one of the filter circuits 14 and 24.

In Step S100, the inductor L3 is determined to have a short-circuit fault in at least one of the filter circuits 14 and 24.

In Step S110, some abnormality is determined to occur in a transmission path of the communication signals Sf and Sb. As a cause of this abnormality, for example, an abnormality of a connector or a harness connecting the signal wiring 4 to the signal transmission device 1D and the electronic device 2D, disconnection of the capacitors 15 and 25, disconnection of a substrate pattern in the signal transmission device 1D and the electronic device 2D, failure of the communication units 11A and 21A, and the like can be considered.

In Step S120, some abnormality is determined to occur in power supply from the signal transmission device 1D to the electronic device 2D. As a cause of this abnormality, for example, disconnection of the signal wiring 4, disconnection of at least one of the filter circuits 14 and 24, failure of the power supply unit 13C, and the like can be considered.

After any of Steps S70 to S120 is executed, the processing illustrated in the flowchart of FIG. 10 ends.

Next, an operation control example of the electronic device 2D performed on the basis of a result of the communication abnormality determination of FIG. 10 will be described with reference to a table of FIG. 11. The table of FIG. 11 illustrates an example of operation control of the electronic device 2D in each of cases where a short-circuit failure occurs in each of the inductors L1 to L3 in the filter circuits 14 and 24 or where a disconnection (open) failure occurs in any of the inductors L1 to L3. The signal transmission device 1D can perform operation control on the electronic device 2D according to a result of the communication abnormality determination of FIG. 10, for example, according to the table of FIG. 11. Note that, in the table of FIG. 11, the signal transmission device 1D as an ECU is represented as "ECU", the electronic device 2D including the camera unit 26 is represented as "camera", the communication signal Sf transmitted from the electronic device 2D to the signal transmission device 1D is represented as "forward channel", and the communication signal Sb transmitted from the signal transmission device 1D to the electronic device 2D is represented as "backward channel".

According to the fifth embodiment of the present invention described above, in a case where a communication abnormality occurs in the signal transmission system, a cause of the abnormality can be identified, and appropriate operation control can be performed on the electronic device 2D.

Sixth Embodiment

Next, a signal transmission device and a signal transmission system according to a sixth embodiment of the present invention will be described. In the present embodiment, an example in which a twisted pair cable is used instead of a coaxial cable for a signal wiring will be described.

Figure 12:
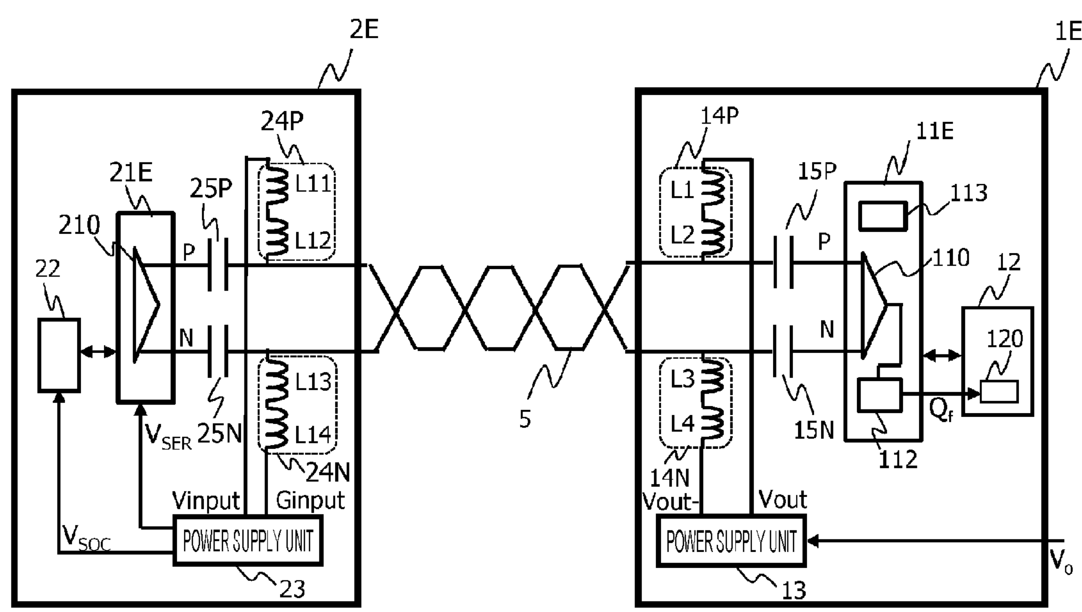
FIG. 12 is a diagram illustrating a configuration of the signal transmission system according to a sixth embodiment of the present invention.

FIG. 12 is a diagram illustrating a configuration of the signal transmission system according to the sixth embodiment of the present invention. In the signal transmission system illustrated in FIG. 12, a signal transmission device 1E and an electronic device 2E are connected to each other via a twisted pair cable 5, and a signal is transmitted between the signal transmission device 1E and the electronic device 2E via the twisted pair cable 5. Note that, hereinafter, signal transmission is assumed to be performed from the electronic device 2E to the signal transmission device 1E, but conversely, signal transmission may be performed from the signal transmission device 1E to the electronic device 2E, or communication may be performed bidirectionally.

As illustrated in FIG. 12, the electronic device 2E of the present embodiment includes a communication unit 21E. The communication unit 21E has the same function as that of the communication unit 21 of FIG. 4 described in the first embodiment, converts communication data output from the signal processing unit 22 into the communication signal Sf, and transmits the communication signal Sf from the transmission circuit 210 to the signal transmission device 1E by differential transmission via the twisted pair cable 5. Capacitors 25P and 25N are connected between the communication unit 21E and the twisted pair cable 5. The capacitors 25P and 25N function as high-pass filters that transmit the communication signal Sf transmitted from the transmission circuit 210, and block the direct current Id supplied from the signal transmission device 1E via the twisted pair cable 5. Between the power supply unit 23 and the twisted pair cable 5, filter circuits 24P and 24N that function as low-pass filters (PoC filters) that transmit the direct current Id supplied from the signal transmission device 1E via the twisted pair cable 5 and block the communication signal Sf transmitted from the transmission circuit 210 are connected. The filter circuit 24P includes the inductors L11 and L12 having different frequency characteristics, and the filter circuit 24N includes inductors L13 and L14 having different frequency characteristics.

Further, the signal transmission device 1E of the present embodiment includes a communication unit 11E. The communication unit 11E has the same function as that of the communication unit 11 of FIGS. 1 and 4 described in the first embodiment, causes the reception circuit 110 to receive the communication signal Sf transmitted from the electronic device 2E by differential transmission via the twisted pair cable 5, and performs decoding of communication data included in the communication signal Sf and acquisition of the communication quality information Qf in the communication signal processing unit 112.

Capacitors 15P and 15N are connected between the communication unit 11E and the twisted pair cable 5. The capacitors 15P and 15N function as high-pass filters that transmit the communication signal Sf transmitted from the electronic device 2E via the twisted pair cable 5, and block the direct current Id output from the power supply unit 13. Between the power supply unit 13 and the twisted pair cable 5, filter circuits 14P and 14N that function as low-pass filters (PoC filters) that that transmit the direct current Id output from the power supply unit 13 and block the communication signal Sf transmitted from the electronic device 2E via the twisted pair cable 5 are connected. The filter circuit 14P includes the inductors L1 and L2 having different frequency characteristics, and the filter circuit 14N includes the inductors L3 and L4 having different frequency characteristics.

Note that, as in the signal transmission system of the present embodiment, compatibility between signal transmission using a twisted pair cable and power supply is called power over data lines (PoDL).

According to the sixth embodiment of the present invention described above, even in a case where a PoDL system that performs signal transmission and power supply using a twisted pair cable between two electronic devices is employed, a failure of a PoC filter can be detected.

Seventh Embodiment

Next, a signal transmission system according to a seventh embodiment of the present invention will be described. In the present embodiment, an example in which two electronic devices are both connected to one signal transmission device will be described.

Figure 13:
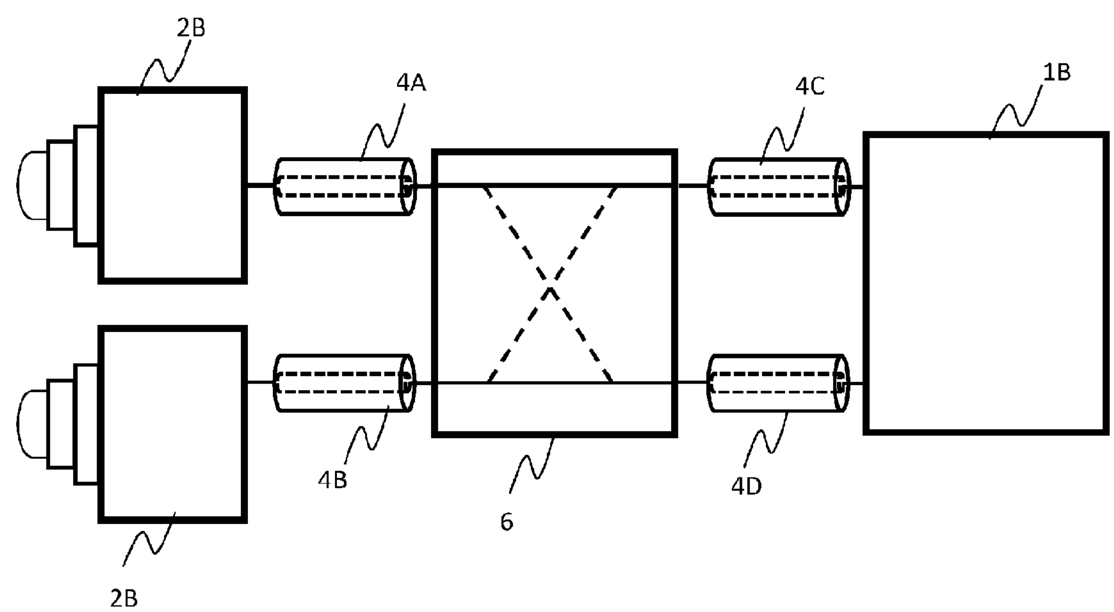
FIG. 13 is a diagram illustrating a configuration of the signal transmission system according to a seventh embodiment of the present invention.

FIG. 13 is a diagram illustrating a configuration of the signal transmission system according to the seventh embodiment of the present invention. In the signal transmission system illustrated in FIG. 13, the signal transmission device 1B and two of the electronic devices 2B are connected to each other via signal wirings 4A to 4D, and a four-way switch 6 is provided between the signal wirings 4A and 4B and the signal wirings 4C and 4D, so that a signal is transmitted between the signal transmission device 1B and two of the electronic devices 2B via the signal wirings 4A to 4D and the four-way switch 6.

In the signal transmission system of the present embodiment, each of the signal transmission device 1B and two of the electronic devices 2B has the configuration described in FIG. 7 in the third embodiment. However, the signal transmission system of the present embodiment may be configured using a signal transmission device and an electronic device described in another embodiment. Further, two of the electronic devices 2B may have the same specifications or different specifications. For example, the camera unit 26 included in one of the electronic devices 2B is a high-resolution camera, and the camera unit 26 included in the other electronic device 2B is a low-resolution camera, so that performance of the two electronic devices 2B can be differentiated from each other.

The four-way switch 6 is a switch capable of optionally switching a connection state between the signal wirings 4A and 4B and the signal wirings 4C and 4D. For example, by switching the four-way switch 6 so as to connect the signal wiring 4A and the signal wiring 4C and connect the signal wiring 4B and the signal wiring 4D, one of the electronic devices 2B can be connected to the signal transmission device 1B via the signal wiring 4A and the signal wiring 4C, and the other electronic device 2B can be connected to the signal transmission device 1B via the signal wiring 4B and the signal wiring 4D. Further, by switching the four-way switch 6 so as to connect the signal wiring 4A and the signal wiring 4D and connect the signal wiring 4B and the signal wiring 4C, one of the electronic devices 2B can be connected to the signal transmission device 1B via the signal wiring 4A and the signal wiring 4D, and the other electronic device 2B can be connected to the signal transmission device 1B via the signal wiring 4B and the signal wiring 4C. Furthermore, by switching the four-way switch 6 so as to connect one of the signal wiring 4C and the signal wiring 4D to both the signal wiring 4A and the signal wiring 4B, two of the electronic devices 2B may be both connected to the signal transmission device 1B via the signal wiring 4C or the signal wiring 4D.

A switching state of the four-way switch 6 is controlled by the signal transmission device 1B. The signal transmission device 1B determines presence or absence of an abnormality in each transmission path on the basis of the communication signals Sf and Sb transmitted and received between two of the electronic devices 2B, and controls a switching state of the four-way switch 6 according to a determination result. By the above, in a case where an abnormality occurs in any of the transmission paths, at least one of the electronic devices 2B can be operated. Therefore, availability of the signal transmission system can be improved.

Note that, in each of the embodiments described above, information other than an error frequency of communication data may be used as the communication quality information Qf and Qb. For example, in a case where the communication unit 11 includes a waveform equivalent circuit in the signal transmission device 1, a setting parameter of the waveform equivalent circuit can be used as the communication quality information Qf and Qb. Note that the waveform equivalent circuit is a circuit for realizing an equalizer function of compensating for signal attenuation due to the signal wiring 4 by adjusting a waveform of a communication signal received by the communication unit 11 according to a frequency characteristic of the signal wiring 4. Since such a waveform equivalent circuit is well known, detailed description of the waveform equivalent circuit will be omitted. Further, the communication unit 11 can also measure a communication signal waveform as described in FIG. 3 and use a measurement result as the communication quality information Qf and Qb. In addition to this, if quality of communication performed by the communication signals Sf and Sb can be appropriately represented, optional information can be used as the communication quality information Qf and Qb.

The embodiments and various variations described above are merely examples, and the present invention is not limited to the content of these examples unless the characteristics of the invention are impaired. Further, although various embodiments and variations are described above, the present invention is not limited to the content of these embodiments and variations. Other modes considered within the scope of the technical idea of the present invention are also included in the scope of the present invention.

REFERENCE SIGNS LIST

1, 1A, 1B, 1C, 1D, 1E signal transmission device
2, 2A, 2B, 2D, 2E electronic device
4, 4A, 4B, 4C, 4D signal wiring

5 twisted pair cable
6 four-way switch
11, 11A, 11B, 11E communication unit
12, 12B, 12C signal processing unit
13, 13C power supply unit
14, 14D, 14N, 14P filter circuit
15, 15N, 15P capacitor
21, 21A, 21E communication unit
22 signal processing unit
23 power supply unit
24, 24D, 24N, 24P filter circuit
25, 25N, 25P capacitor
26 camera unit
110 reception circuit
111 transmission circuit
112 communication signal processing unit
113 communication speed change function
120, 120B, 120C filter state determination unit
210 transmission circuit
211 reception circuit

The invention claimed is:

1. A signal transmission device comprising:

a communication unit that is connected to an electronic device by a signal wiring and performs communication with the electronic device via the signal wiring;

a signal processing unit that performs signal processing related to the communication;

a power supply unit that supplies direct current to the electronic device via the signal wiring; and a filter circuit connected between the signal wiring and the power supply unit, wherein the filter circuit includes a plurality of filters having frequency characteristics different from each other, and the signal processing unit acquires communication quality information indicating quality of the communication in at least two or more frequency bands, and determines a state of the filter circuit based on the communication quality information.

2. The signal transmission device according to claim 1, wherein the communication unit receives a signal transmitted from the electronic device in a first frequency band and a signal transmitted from the electronic device in a second frequency band different from the first frequency band, and the signal processing unit determines a state of the filter circuit based on the communication quality information in the first frequency band and the communication quality information in the second frequency band.

3. The signal transmission device according to claim 1, wherein the communication unit has a bidirectional communication function of receiving a signal transmitted from the electronic device and transmitting a signal to the electronic device.

4. The signal transmission device according to claim 3, wherein the communication unit receives a signal transmitted from the electronic device in a first frequency band and transmits a signal to the electronic device in a second frequency band different from the first frequency band, and the signal processing unit determines a state of the filter circuit based on the communication quality information in the first frequency band and the communication quality information in the second frequency band.

5. The signal transmission device according to claim 4, wherein the electronic device includes a sensor that detects a surrounding environment of a vehicle, and the communication unit receives a signal including information regarding a detection result of the surrounding environment from the electronic device in the first frequency band, and transmits a signal including control information for controlling operation of the sensor to the electronic device in the second frequency band.

6. The signal transmission device according to claim 1, wherein the signal processing unit acquires power supply information indicating a supply state of the direct current in the power supply unit, and determines a state of the filter circuit and the power supply unit based on the communication quality information and the power supply information.

7. The signal transmission device according to claim 1, wherein the signal wiring is a coaxial cable or a twisted pair cable.

8. The signal transmission device according to claim 1, wherein the communication quality information includes at least any one of a data error frequency of the communication, a setting parameter of a waveform equivalent circuit included in the communication unit, and a measurement result of a signal waveform in the communication.

9. The signal transmission device according to claim 1, wherein an operation mode of the electronic device is changed based on a determination result of a state of the filter circuit by the signal processing unit.

10. A signal transmission system comprising:

a first electronic device; and a second electronic device connected to the first electronic device by a signal wiring, wherein the first electronic device includes:

a first communication unit that performs communication with the second electronic device via the signal wiring;

a first signal processing unit that performs signal processing related to the communication;

a first power supply unit that supplies direct current to the second electronic device via the signal wiring; and a first filter circuit connected between the signal wiring and the first power supply unit, the second electronic device includes:

a second communication unit that performs communication with the first electronic device via the signal wiring;

a second signal processing unit that performs signal processing related to the communication;

a second power supply unit that supplies power to the second communication unit and the second signal processing unit by using the direct current supplied from the first electronic device via the signal wiring; and a second filter circuit connected between the signal wiring and the second power supply unit, each of the first filter circuit and the second filter circuit includes a plurality of filters having frequency characteristics different from each other, and the first signal processing unit acquires communication quality information indicating quality of the communication in at least two or more frequency bands, and determines a state of the first filter circuit and the second filter circuit based on the communication quality information.

11. The signal transmission system according to claim 10, further comprising:

a third electronic device connected to the first electronic device by a signal wiring; and a switch provided between the first electronic device, the second electronic device, and the third electronic device, wherein the third electronic device includes:

a third communication unit that performs communication with the first electronic device via the signal wiring;

a third signal processing unit that performs signal processing related to the communication;

a third power supply unit that supplies power to the third communication unit and the third signal processing unit using the direct current supplied from the first electronic device via the signal wiring; and a third filter circuit connected between the signal wiring and the third power supply unit, the first signal processing unit further determines a state of the third filter circuit based on the communication quality information, the signal wiring includes a first signal wiring connecting the second electronic device and the switch, a second signal wiring connecting the third electronic device and the switch, and a third signal wiring and a fourth signal wiring connecting the first electronic device and the switch, and the switch switches connection between the first signal wiring and the second signal wiring, and connection between the third signal wiring and the fourth signal wiring based on a determination result of a state of the first filter circuit, the second filter circuit, and the third filter circuit by the first signal processing unit.

* * * * *